United States Patent [19]

MacDonald et al.

[11] Patent Number: 5,136,413

[45] Date of Patent: Aug. 4, 1992

[54] IMAGING AND ILLUMINATION SYSTEM WITH ASPHERIZATION AND ABERRATION CORRECTION BY PHASE STEPS

[75] Inventors: Bruce G. MacDonald, San Diego; Robert O. Hunter, Jr., Rancho Santa Fe; Adlai H. Smith, San Diego, all of Calif.

[73] Assignee: Litel Instruments, San Diego, Calif.

[21] Appl. No.: 609,830

[22] Filed: Nov. 5, 1990

[51] Int. Cl.[5] .......................................... G02B 26/10
[52] U.S. Cl. ................................... 359/213; 359/224; 359/859; 359/869; 250/236; 250/348; 362/328
[58] Field of Search .............. 359/213, 196, 220, 221, 359/223, 224, 896, 859, 869; 250/234, 235, 236, 230, 347, 348, 353, 354.1, 201.9, 201.8, 201.5; 362/328

[56] References Cited

U.S. PATENT DOCUMENTS

| | | | |
|---|---|---|---|
| 4,653,880 | 3/1987 | Sting et al. | 359/859 |
| 4,736,132 | 4/1988 | Culp | 359/224 |
| 4,746,205 | 5/1988 | Cross et al. | 359/859 |
| 4,861,148 | 8/1989 | Sato et al. | 359/859 |
| 4,863,253 | 9/1989 | Shafer et al. | 359/859 |

*Primary Examiner*—Loha Ben
*Attorney, Agent, or Firm*—Brown, Martin, Haller & McClain

[57] ABSTRACT

The imaging and illumination system with aspherization and aberration correction by phase steps includes two transparent phase plates within the optical train of a stepper illumination system. The first plate places each ray at the corrected position on the axial stigmatism plate to satisfy the sine condition. The second plate, which is the axial stigmatism plate, ensures that each ray of light focuses at the focal point. The aberration corrected light is reflected by a deformable mirror toward a secondary mirror, a primary mirror and finally onto a wafer to project a single field of large dimension. The secondary and primary mirrors provide aspherization by forming phase steps in the surfaces of the mirrors. The deformable mirror, to permit realtime correction of aberrations and manipulation of the beam for each field imaged by the system. A set of two-dimensional scanning mirrors is placed between the laser light source and a reticle containing to pattern which is to be transferred to the wafer. These mirrors step a beam across the reticle a single sub-field of the pattern at a time. Such individual stepping permits the deformable mirror to correct for each sub-field thereby allowing a very large field of view for the image transferred to the wafer.

23 Claims, 2 Drawing Sheets

IMAGING AND ILLUMINATION SYSTEM WITH ASPHERIZATION AND ABERRATION CORRECTION BY PHASE STEPS

BACKGROUND OF THE INVENTION

Lithography is a key factor in the drive for higher levels of microcircuit integration. Dynamic RAMs have quadrupled in the level of integration every three years as a result of the reduction in minimum geometries and increases in chip size. As minimum geometries approach 0.5 μm and below, lithography alternatives include optics, electron beam direct write, X-ray and electron/ion beam proximity technologies. The latter three technologies are still in their infancy relative to optical lithography and still have obstacles to overcome, including decreased throughput, low source brightness and mask complexity, respectively.

While optical lithography continues to be the dominant technology because it is well established and is capable of implementing sub-micron resolution at least as low as 0.35 μm, efforts into attaining smaller geometries are looking toward the newer technologies. In both optical lithography and its alternatives, progress into the realm of shorter wavelengths introduces increased sensitivities to minute surface imperfections including contaminants on optical surfaces, aberrations introduced by lenses and mirrors, photoresist thickness and surface variations and wafer flatness and planarity.

Addressing the issue of aberrations, due to manufacturing limitations most optical elements have plane, spherical or paraboloidal form. The restriction to surfaces of simple form imposes limitations in an optical system's ability to realize diffraction-limited performance due to aberrations, especially where a larger field of view is desired, as in a stepper. Aspheric surfaces can provide correction of the aberrations at the cost of substantially increased manufacturing complexity. By making one surface of a centered optical system aspherical it is possible to achieve exact axial stigmatism. By the use of two aspheric surfaces, the system may be made aplanatic, facilitating attainment of a diffraction-limited beam. Production of a conventional aspheric requires the removal of material from a surface by an iterative cycle of polishing then measuring the surface to achieve the asphere. This technique is severely limited by the lack of precision in the measurement techniques.

Where the illuminating light is coherent and has a narrow bandwidth, a binary phase plate, which is usually a thin plate of transparent material with steps of λ/2 formed on its surface, will act as an asphere. As with aspheres, the use of two phase plates will provide the desired aspheric shapes to make the optical system diffraction-limited. A reflective surface may similarly be made aspheric by the use of phase steps. More than two values, i.e., binary, of the phase modulation can be used in order to avoid scattering the edges of large steps.

The manufacturing process for phase plates is substantially easier than that for conventional aspheres, using common lithographic techniques. Since most steppers use narrowband illumination it would be desirable to provide a stepper illumination system in which aspherization is accomplished by phase plates, thereby providing a large field of view in a diffraction-limited system. It is to such a system that the present invention is directed.

SUMMARY OF THE INVENTION

It is an advantage of the present invention to provide an imaging and illumination system which utilizes optical elements with phase steps for aspherization and aberration correction.

It is a further advantage of the present invention to provide an imaging and illumination system which extends diffraction-limited imaging to large fields of view.

It is another advantage of the present invention to provide an imaging and illumination system which permits aberration correction for different parts of a field of view without mechanical scanning of the mask or wafer further facilitating diffraction-limited imaging over a large field of view.

In an exemplary embodiment, two transparent phase plates are placed within the optical train of a stepper imaging and illumination system. The first plate places each ray at the corrected position on the axial stigmatism plate to satisfy the sine condition. The second plate, which is the axial stigmatism plate, ensures that each ray of light focuses at the focal point. The aberration corrected light is reflected by a deformable mirror toward a secondary mirror, a primary mirror and finally onto a wafer to project a single field of large dimension. The secondary and primary mirrors provide aspherization by forming phase steps in the surfaces of the mirrors. All reflective surfaces are coated with an appropriate thin film to assure optimal reflection at the selected wavelength. The surface roughness of the steps is small to minimize light scattered by the edges of the steps.

The deformable mirror, its use for steppers being disclosed in a co-pending application (U.S. patent application Ser. No. 07/609,888, filed Nov. 5, 1990), is operated by signals applied to actuators attached to the backside of a thin mirror. An interference fringe formed by the combination of incident light and light reflected from the wafer surface at a beamsplitter disposed within the optical train. The interference fringe is detected and used by a computer to provide a signal for activation of the actuators to permit realtime correction of aberrations and manipulation of the beam for each field imaged by the system.

A set of two-dimensional scanning mirrors is placed between the laser light source and a reticle containing the pattern which is to be transferred to the wafer. These mirrors step a beam across the reticle a single sub-field of the pattern at a time. Such individual stepping permits the deformable mirror to correct for each sub-field thereby allowing a very large field of view for the image transferred to the wafer. The deformable mirror may also be actuated to locate the beam at the correct position of the secondary and primary mirrors to focus on the desired sub-field on the wafer.

In an alternate exemplary embodiment, the imaging and illumination system comprises a pair of phase plates placed in the optical train of a folded beam refractive optic system including a deformable mirror and an interferometric feedback system as above. The flat mirrors used in the folded beam system may be aspherized in a mirror similar to the parabolic mirror of the first embodiment.

In another alternate embodiment, a pure refractive optic imaging and illumination system has a pair of phase plates within its optical train between the optics and the wafer. Such a system may include a detour to provide access to a deformable mirror to compensate for uncorrected aberrations.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF THE PREFERRED EMBODIMENT

Figure 1:
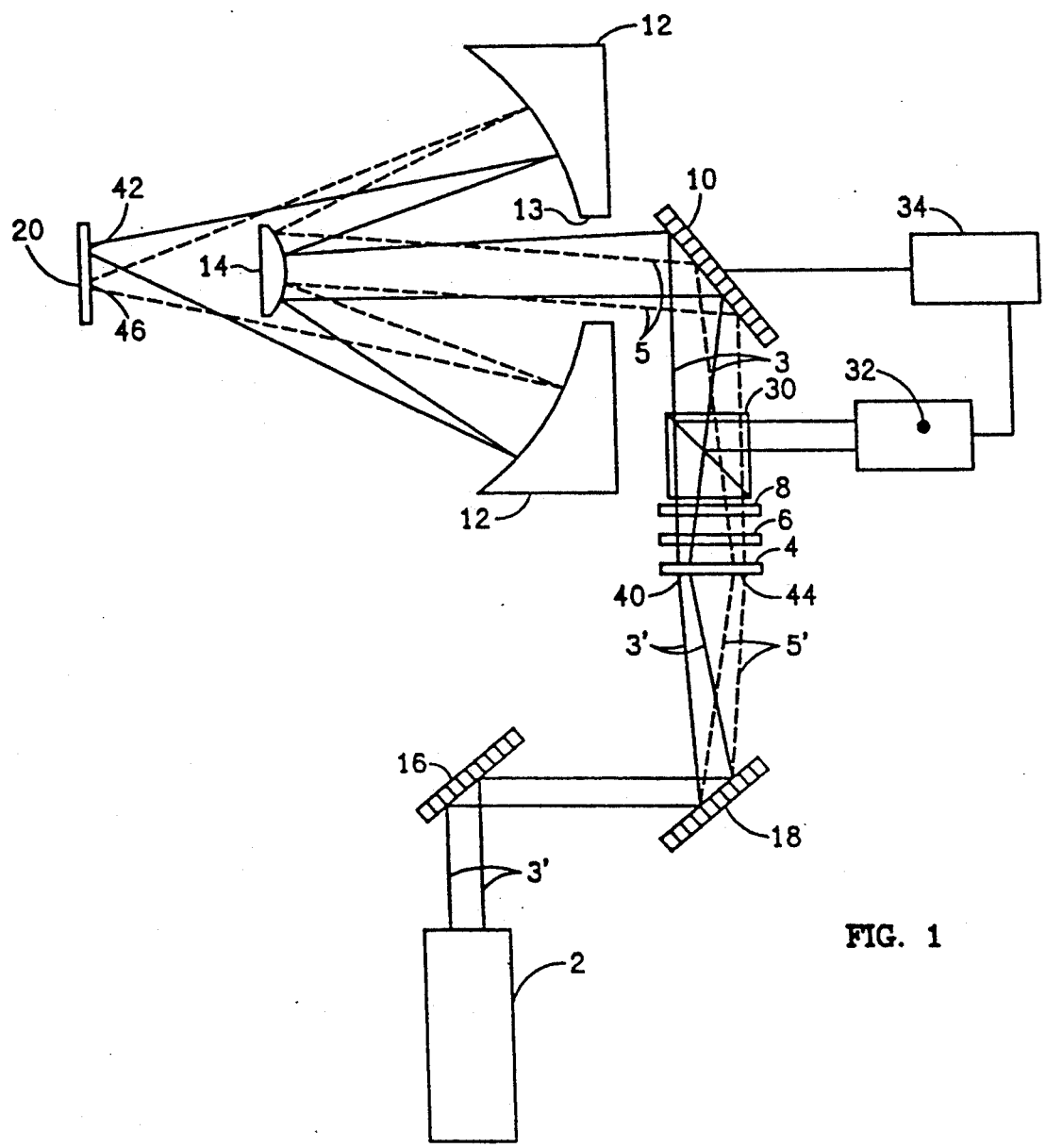
FIG. 1 is a diagrammatic view of a first embodiment of the imaging and illumination system indicating a scan of two separate sub-fields.

As illustrated in FIG. 1, the preferred embodiment comprises a light source 2 which projects beam 3 for reflection by scanning mirrors 16 and 18. Beam 3 is focused onto and projected through patterned reticle 4, becoming modulated beam 3, which is projected through first phase plate 6 and second phase plate 8 toward deformable mirror 10. Modulated beam 3 is reflected toward secondary mirror 14 and primary mirror 12 then finally focused onto wafer 20 to produce a reduced pattern of patterned reticle 4.

Light source 2 is preferably a laser which provides illuminating light of a narrow bandwidth such that the coherence length is larger than the peak optical path difference of the asphere or phase step. For example, for an f/1 reflective microscope, the optical path difference of the asphere is as much as 500 waves at 0.2 micron. The light must have a coherence length greater than 1,000 waves at 0.2 micron, or a bandwidth less than 2 Å so that interference effects are not lost. Typical lasers for this application include excimer lasers with various gas mixtures of krypton, fluorine and argon, which emit light at wavelengths of about 250 nm and smaller. If light emitted by an arc lamp can be made to have a sufficiently narrow bandwidth, arc lamps may also be used as a light source.

Reticle 4 is positioned within the path of beam 3 so that selected sub-fields 40 and 44 of the reticle can be illuminated so that the modulated beams 3 and 5 carry the image of the sub-fields 40 and 44, respectively, through which it passed. The reticle 4 is sufficiently stabilized to retain it in a constant location relative to the beam path and adjustably mounted to facilitate alignment with previous mask levels. The pattern on the reticle 4 is that of a single mask level within the semiconductor process and is a magnification on the order of 4× or greater of the die size of the pattern to be projected onto the wafer 20.

First phase plate 6 is an aplanatism plate which acts as an asphere to place each light ray within beam 3 onto the correct position on the second phase plate to satisfy the sine condition. The sine condition is satisfied when the ratio of the sine of the angles made between corresponding rays at the object and image points and the axis of an optical train is constant.

Second phase plate 8 is an axial stigmatism plate which ensures that each ray with the beam focuses at the focal point.

Field correction can also be altered by methods other than that of axial stigmatism and the sine condition. These methods, similar to simulated annealing in ensuring the stigmatism and sine condition weighted over the desired field, may be used to generate the desired pattern.

Both first phase plate 6 and second phase plate 8 may be made on a single surface of a refractive element or the reflective surface of a mirror by forming phase steps in the surface. Formation of phase steps is easiest with a flat plate but the procedure may be applied to any shape optical surface.

Figure 2A:
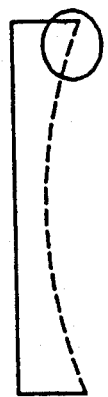
FIG. 2A is a view of multiple phase steps in an aspheric mirror.
Figure 2C:
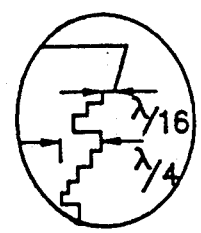
FIG. 2C is an enlarged segment of FIG. 2A.
Figure 2B:
FIG. 2B illustrates binary phase steps in a refractive elements.
Figure 2D:
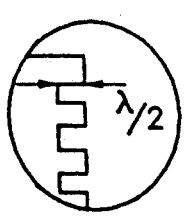
FIG. 2D is an enlarged segment of FIG. 2B.

One method of forming phase steps is to selectively remove material from the surface. A direct (laser ablation) or lithographic process may be used for this purpose. In a lithographic process, the surface is coated with a photoresist which is exposed to a pattern. Unexposed photoresist is removed leaving the area underlying the unexposed resist available for etching. Etch techniques including wet etch (e.g., HF for quartz, $H_3PO_4 + HNO_3 + C_2H_4O_2$ for aluminum) and reactive ion etching may be used to achieve the desired step depth. Subsequent patterning and etching may be used to increase the number of steps. While a single patterning-and-etch cycle provides a binary phase step (0 and $\lambda/4$ for a reflector, 0 and $\lambda/2$ for a refractive element as in FIGS. 2B and 2D), it is preferable to increase the number of steps to reduce surface roughness thereby minimizing scattered light. For a binary phase step the Strehl value is 0.4 whereas for sixteen steps it is near unity. Therefore, it would be desirable to repeat the patterning and etching cycle four times to produce 16 steps, each step height being $\lambda/32$ for a reflector, causing a $\lambda/16$ change in the wavefront, as shown in FIG. 2A and 2C. For a phase plate or refractive element, each step height is $\lambda/16$.

Phase steps may also be formed on reflective surfaces by deposition of metal such as gold or aluminum either by direct writing or by proximity mask deposition.

Phase steps advance or retard a ray of light depending on the step height. A wavefront may therefore be aspherically corrected by selective formation of phase steps.

Downstream from the phase plates is deformable mirror 10 which redirects beam 3 toward secondary mirror 14. Deformable mirror 10 comprises a reflective surface with a plurality of electrodistortive actuators attached on its backside. These actuators may be selectively operated by applying an electrical signal thereto to elongate each actuator to distort the reflective surface. The number and spacing of the actuators are chosen on the basis of precision desired, the severity of aberrations to be removed and the amount of fine adjustment required to scan the beam 3 to pattern different sub-fields 42 and 46 on the wafer 20.

Beam 3 is directed toward secondary mirror 14 and primary mirror 12 which are configured as a Cassegrainian telescope. Primary mirror 12 has an opening 13 at its center through which beam 3 passes to permit access to secondary mirror 14. Secondary mirror 14, which expands beam 3 carrying the pattern image, is aspherized by the formation of phase steps in its reflective surface. As described above, the phase steps are preferably on the order of λ/16 to efficiently reflect the expanded beam 3 to primary mirror 12.

Primary mirror 12 is a large diameter (∼ 1 meter) parabolic mirror which focuses the image onto wafer 20. Primary mirror 12 is formed as a strong asphere using multiple phase steps as described above. For the present embodiment, primary mirror 12 is an f/1 reflector, 1 meter in diameter, with a peak slope of above 500 waves/meter.

Wafer 20 is mounted on a stage which provides no movement or course movement for scanning or focus adjustment. Scanning is instead provided by the combination of scanning mirrors 16 and 18 and deformable mirror 10.

Scanning mirrors 16 and 18 provide horizontal and vertical scanning of reticle 4 by beam 3'. Scanning mirror 18 may also include a curvature of its reflective surface to focus beam 3' at the reticle 4.

Comparing beams 3 and 5, sub-field 42 on the wafer 20 corresponds to sub-field 40 on the reticle 4. Region 46 on the wafer corresponds to sub-field 44 on the reticle 4. In the area of the primary and secondary mirrors the beams 3 and 5 from 40 to 42 and 44 to 46, respectively, pass through the same region but do not follow identical paths. It would be difficult to correct for an expanded beam which was carrying the full pattern of reticle 4 using deformable mirror 10. This concept is more simply illustrated in FIG. 3 and where a generic aspheric optical system is represented by lens 50. By use of scanning mirrors 16 and 18 a smaller beam may be projected to illuminate single sub-fields permitting individual correction for each sub-field using deformable mirror 10. Therefore sub-fields 42 and 46 are independently corrected allowing the entire field of the wafer 20 and reticle 4 to be illuminated and mapped with good optical correction. This method permits realization of large fields with near diffraction-limited performance.

An interferometer system 32 including an associated monitoring laser emitting at a longer wavelength than is needed for exposure is used to sense the needed correction by projecting a beam parallel to beam 3. The monitoring beam is reflected back from the polished surface of wafer 20 to retrace the path of beam 3 back to beamsplitter 30 where it combines with a portion of the incident light from the monitoring laser to create an interference fringe pattern. This pattern is representative of the wavefront distortion for the particular sub-field which is being exposed and is detected by a camera and converted into an electrical signal for processing by the computer 34.

Computer 34, using a series of preprogrammed algorithms, determines a correlation between the fringe pattern and aberration and/or distortion of the optical wavefront. After determining the amount and type of distortion, the computer 34 provides a series of signals to drive the actuators of deformable mirror 10, providing correction of depth of focus, thermal fluctuations and mechanical misalignment.

Figure 3:
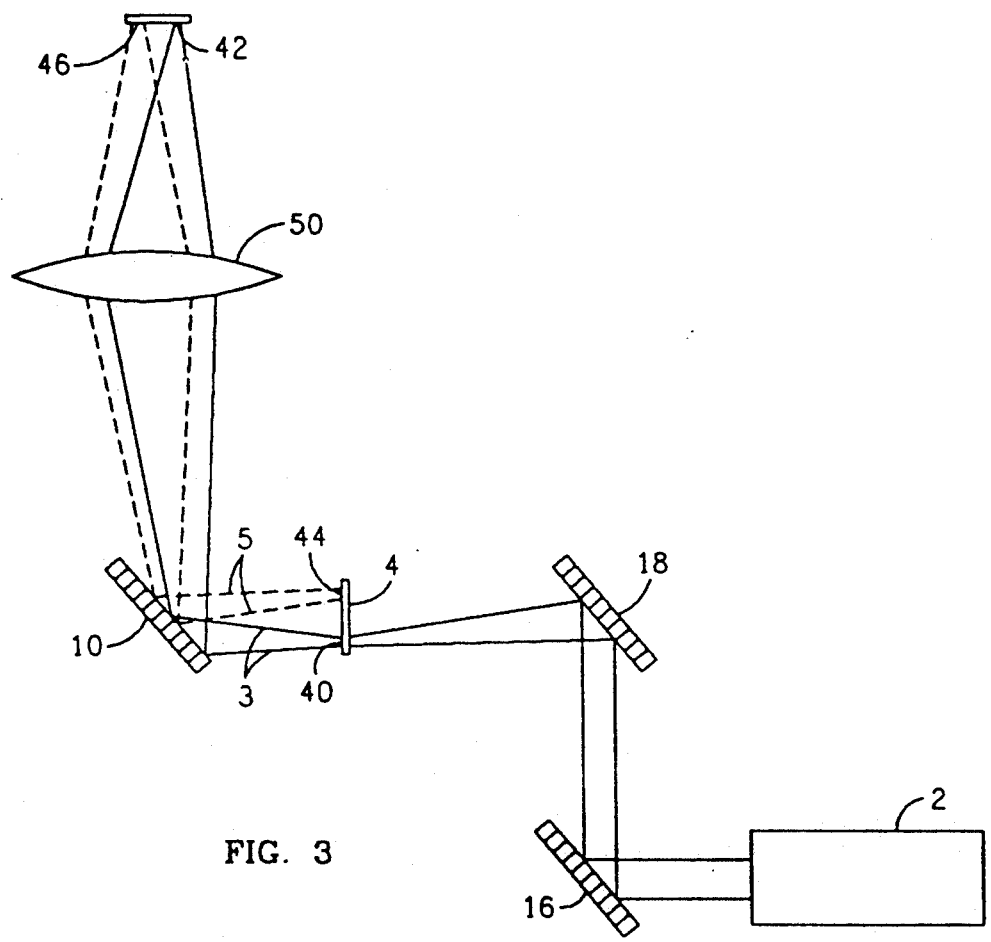
FIG. 3 is a diagrammatic view of a second embodiment indicating use with a generic optical train.

In alternate embodiments the aspheric optical system represented by lens 50 in FIG. 3 may be either a pure refractive optical system with aspherization provided by phase steps formed in one surface of one or more elements of the optical system. Lens 50 may also be a combination refractive and reflective system, such as a folded beam projection system in which the reflective surfaces and one or more of the refractive elements are aspherized using phase steps.

Figure 4:
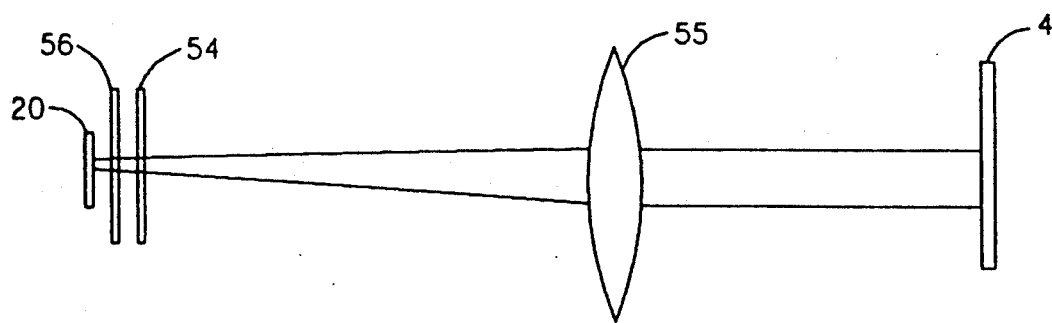
FIG. 4 is a diagrammatic view of an alternate embodiment illustrating alternative placement of phase plates.

As shown in FIG. 4, if the optical train 55 (meaning any of the above-described focus and reduction optics) is sufficiently aberration corrected the phase plates 54 and 56 may be located close to the wafer 20 where they have different parts of the field passing through them. The phase plates can then be used to compensate for aberrations as a function of field of view and so can produce diffraction-limited imaging over a very large field.

The imaging and illumination system of the present invention provides diffraction-limited performance by the use of phase steps, a deformable mirror and a scanned beam. This permits projection of a very large field onto the wafer with each sub-field being individually corrected.

It will be evident that there are additional embodiments which are not illustrated above but which are clearly within the scope and spirit of the present invention. The above description and drawings are therefore intended to be exemplary only and the scope of the invention is to be limited solely by the appended claims.

We claim:

1. A stepper imaging and illumination system for projecting an image with a field of view onto a wafer wherein a beam modulated by projection through a reticle having a magnification of said image carries said image and is substantially aberration corrected, said system comprising:
a coherent light source for generating said beam, said light source having a narrow bandwidth;
a first phase plate having a plurality of phase steps for attaining a sine condition of said beam;
a second phase plate adjacent to said first phase plate, said second phase plate having a plurality of phase steps for attaining axial stigmatism of said beam; and
an optical system for reducing and focusing said image onto said wafer;
wherein said beam generated by said light source is projected through said reticle into said optical system to be focused onto said wafer, said wafer reflecting a portion of said beam, said first phase plate and said second phase plate being disposed in a path of said beam between said reticle and said wafer.

2. A stepper imaging and illumination system as in claim 1 further comprising:
a deformable mirror disposed between said reticle and said optical system said deformable mirror having a plurality of distortive actuators for selective deformation of a reflective surface of said deformable mirror.

3. A stepper imaging and illumination system as in claim 2 wherein said first and second phase plates are disposed between said reticle and said deformable mirror so that said beam impinging upon said deformable mirror is aberration corrected.

4. A stepper imaging and illumination system as in claim 2 further comprising a means for two-dimensional scanning disposed between said light source and said reticle, said reticle having a plurality of sub-fields, said two-dimensional scanning means sequentially illuminating each said sub-field so that said deformable mirror provides aberration correction for each said sub-field.

5. A stepper imaging and illumination system as in claim 1 wherein said optical system is aspherically-compensated and comprises a primary mirror and a secondary mirror, said secondary mirror expanding and reflecting said beam toward said primary mirror and said primary mirror reducing and focusing said beam onto said wafer, at least one of said primary mirror and said secondary mirror having a plurality of phase steps therein for aberration correction.

6. A stepper imaging and illumination system as in claim 5 wherein each phase step of said plurality is $\lambda/16$ in each mirror having phase steps.

7. A stepper imaging and illumination system as in claim 1 wherein said optical system is aspherically-compensated and comprises a combination of refractive elements having a plurality of phase steps formed in one surface of at least one refractive element of said combination for aberration correction.

8. A stepper imaging and illumination system as in claim 1 wherein said optical system is aspherically-compensated and comprises a combination of refractive elements and reflective elements, at least one element of said combination having a plurality of phase steps formed therein for aberration correction.

9. A stepper imaging and illumination system as in claim 8, wherein each phase step of said plurality is $\lambda/8$ in each phase plate and said at least one element has phase steps.

10. A stepper imaging and illumination system as in claim 1 wherein said first phase plate comprises a thin transparent plate having said plurality of phase steps formed therein.

11. A stepper imaging and illumination system as in claim 1 wherein said second phase plate comprises a thin transparent plate having said plurality of phase steps therein.

12. A stepper imaging and illumination system as in claim 1 wherein said first phase plate and said second phase plate are disposed between said optical system and said wafer.

13. A stepper imaging and illumination system as in claim 7 wherein each phase step of said plurality is $\lambda/8$ in each phase plate and said at least one refractive element has phase steps.

14. An illumination system for projecting an image with a large field of view onto a target surface wherein a beam modulated by projection through a mask having a magnification of said image carries said image and is aberration corrected, said system comprising:
  a coherent light source for projecting said beam through said mask, said light source having a narrow bandwidth;
  a means for two-dimensional scanning disposed between said light source and said mask, said mask comprising a plurality of single sub-fields, so that said beam illuminates each single sub-field, said plurality of single sub-fields being sequentially illuminated by said scanning means;
  a first phase plate downstream from said mask for attaining a sine condition of said modulated beam;
  a second phase plate adjacent to said first phase plate for attaining axial stigmatism of said modulated beam;
  a deformable mirror downstream from said first and second phase plates for redirecting said modulated beam, said deformable mirror having means for selective deformation to provide aberration correction for each said single sub-field; and
  an aspherically-compensated optical system for receiving said modulated beam from said deformable mirror for reducing and focusing said image onto said target surface.

15. A system as in claim 14 wherein said aspherically-compensated optical system comprises a primary mirror and a secondary mirror, said secondary mirror expanding and reflecting said beam toward said primary mirror and said primary mirror reducing and focusing said beam onto said target surface, at least one of said primary mirror and said secondary mirror having a plurality of phase steps therein for aberration correction.

16. An illumination system as in claim 15 wherein each phase step of said plurality is $\lambda/16$ in each mirror having phase steps.

17. An illumination system as in claim 14 wherein said aspherically-compensated optical system comprises a combination of refractive elements having a plurality of phase steps formed in one surface of at least one refractive element of said combination for aberration correction.

18. An illumination system as in claim 17 wherein each phase step of said plurality is $\lambda/8$ in each phase plate and said at least one refractive element has phase steps.

19. An illumination system as in claim 14 wherein said aspherically-compensated optical system comprises a combination of refractive elements and reflective elements, at least one element of said combination having a plurality of phase steps formed therein for aberration correction.

20. An illuminating system as in claim 19, wherein each phase step of said plurality is $\lambda/8$ in each phase plate and said at least one element has phase steps.

21. A projection system for projecting an image onto a target surface wherein a beam modulated by a modulation means carries said image, said system comprising:
  a coherent light source for projecting said beam through said modulation means;
  a first phase plate having a plurality of phase steps downstream from said modulation means for attaining a sine condition of said modulated beam;
  a second phase plate having a plurality of phase steps adjacent to said first phase plate for attaining axial stigmatism of said modulated beam; and
  an optical system for receiving said modulated beam for focusing said image onto said target surface.

22. A projection system as in claim 21 further comprising a deformable mirror disposed between said second phase plate and said optical system to provide aberration correction means.

23. A projection system as in claim 21 wherein said optical system is aspherically-compensated and comprises a plurality of optical elements, at least one of said optical elements having a plurality of phase steps formed therein.

* * * * *